United States Patent
Seki et al.

(10) Patent No.: US 7,229,569 B1
(45) Date of Patent: Jun. 12, 2007

(54) ETCHING REAGENT, AND METHOD FOR MANUFACTURING ELECTRONIC DEVICE SUBSTRATE AND ELECTRONIC DEVICE

(75) Inventors: Hitoshi Seki, Miyagi-ken (JP); Jo Gyoo Chul, Miyagi-ken (JP)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/595,415

(22) Filed: Jun. 16, 2000

(30) Foreign Application Priority Data

Jun. 18, 1999 (JP) ............................. 11-173431
Jan. 6, 2000 (JP) ............................. 2000-001127

(51) Int. Cl.
*C09K 13/00* (2006.01)

(52) U.S. Cl. ............... 252/79.1; 252/79.4; 216/100; 174/250; 174/254

(58) Field of Classification Search ........... 252/79.1, 252/79.4; 216/100; 174/250, 254
See application file for complete search history.

(56) References Cited

U.S. PATENT DOCUMENTS

| | | | | |
|---|---|---|---|---|
| 3,779,842 A | * | 12/1973 | Grunwald et al. | 216/106 |
| 3,869,401 A | * | 3/1975 | Ernst | 252/186.29 |
| 3,986,970 A | * | 10/1976 | Shiga | 252/79.3 |
| 4,297,436 A | * | 10/1981 | Kubotera et al. | 430/310 |
| 4,349,411 A | * | 9/1982 | Okinaka | 216/22 |
| 4,849,124 A | * | 7/1989 | Backus | 252/79.4 |
| 5,225,034 A | * | 7/1993 | Yu et al. | 438/693 |
| 5,259,979 A | * | 11/1993 | Condra et al. | 252/79.2 |
| 5,342,501 A | * | 8/1994 | Okabayashi | 205/50 |
| 5,958,288 A | * | 9/1999 | Mueller et al. | 252/186.1 |
| 6,222,136 B1 | * | 4/2001 | Appelt et al. | 174/254 |

* cited by examiner

*Primary Examiner*—Shamim Ahmed
(74) *Attorney, Agent, or Firm*—Brinks Hofer Gilson & Lione

(57) ABSTRACT

The present invention provides an etching agent that is able to etch a Cu film by a simple chemical etching method such as an immersion method when the low resistance Cu film is used for a wiring material, while allowing time-dependent changes of the etching rate to be small and preventing a pattern narrowing phenomenon ascribed to irregular amount of side etching of the Cu film from occurring, by providing an etching agent comprising an aqueous solution containing potassium hydrogen peroxosulfate and hydrofluoric acid, wherein masks of a give pattern is formed on the surface of a laminated film prepared by sequentially depositing a Ti or Ti alloy film and a Cu film on a substrate, and wherein a gate electrode (a laminated wiring) and a lower pad layer (a laminated wiring) with give patterns are formed by etching the laminated film using the etching agent having the foregoing construction.

12 Claims, 12 Drawing Sheets

ETCHING REAGENT, AND METHOD FOR MANUFACTURING ELECTRONIC DEVICE SUBSTRATE AND ELECTRONIC DEVICE

BACKGROUND OF THE INVENTION

1. Field of the Invention

The present invention relates to an etching reagent for manufacturing a wiring using low resistance copper, and a method for manufacturing an electronic device substrate and an electronic device.

2. Description of the Related Art

An example of electronic devices comprises a thin film transistor type liquid crystal display device.

FIG. 9 is an illustrative drawing of the conventional thin film transistor type liquid crystal display device.

A gate electrode 84 comprising a conductive material such as Al or an Al alloy is provided on a substrate 83 of this thin film transistor 82, and a gate insulation film 85 is provided so as to cover the gate electrode 84. A semiconductor active film 86 comprising an amorphous silicon (abbreviated as a-Si hereinafter) is provided on the gate insulation film 85 above the gate electrode 84, and a source electrode 88 and a drain electrode 89 comprising a conductive material such as Al or an Al alloy are provided via an ohmic contact layer 87 comprising an amorphous silicon containing a N-type impurity such as phosphorus (abbreviated as a $N^+$-type a-Si hereinafter) from the semiconductor active film 86 through the gate insulation film 85. A passivation film 90 is provided so as to cover the thin film transistor 82 composed of these source electrode 88, drain electrode 89, gate electrode 84 and the like, and a contact hole 91 is provided through the passivation film 90 on the drain electrode 89. A pixel electrode 92 comprising a transparent electrode layer comprising indium tin oxide (abbreviated as ITO hereinafter) that is electrically connected to the drain electrode 89 trough the contact hole 91 is additionally provided.

The left portion of FIG. 9 shows a cross sectional structure of a gate terminal pad portion 93 at the end of the gate wiring located at outside of the display area. A contact hole 95 perforating through the gate insulation film 85 and passivation film 90 is provided on a lower pad layer 94 comprising a gate wiring material such as Al or an Al alloy on the substrate 83. An upper pad layer 96 comprising a transparent electrode layer, which is electrically connected to the lower pad layer 94 through the contact hole 95, is also provided.

The problem of retardation of signal transmission due to the resistance of electrodes such as the gate electrodes, source electrode, and drain electrode, and the resistance of wiring such as the gate wiring, source wiring and drain wiring have became apparent in compliance with the recent development of the high speed liquid crystal display device. Accordingly, use of copper having a lower resistance than that of Al or an Al alloy has been studied for solving the problems as described above. The materials constituting the electrode such as the gate electrode are also included in the wiring materials herein.

A Cu wiring can be formed, like constructing a wiring with Al or an Al alloy, by the steps comprising: forming a Cu film by a conventional sputtering method, forming a given mask pattern on the surface of the Cu film by photolithography, etching the Cu film using a given etching agent, and removing the Cu film except the area for forming the wiring.

The etching agents for Cu known in the art comprise PAN based (phosphoric acid-acetic acid-nitric acid based) etching agents, and ammonium peroxosulfate and acetic acid-hydrogen peroxide based etching agents, which have been frequently used for the etching agent for use in fine processing.

However, when a mask pattern 84b as shown in FIG. 10A, formed on the surface of a Cu film 84a deposited on a substrate 83a for forming a wiring, is subjected to etching by immersing it in an ammonium peroxosulfate based or PAN based etching agent in a stationary state, the Cu film 84a at the periphery of the mask pattern 84b is etched with an abnormally high etching rate to increase the amount of etching at the central portion at the side faces of the Cu film 84a more than the amount of etching at the remaining portions. As a result, the line width of the wiring 84c turns out to be narrower than the width of the mask pattern 84b (slimming phenomenon of the pattern) as shown in FIG. 10C.

When a mixed solution of acetic acid and hydrogen peroxide or an ammonium peroxosulfate solution is used as an etching agent, it is difficult to control the immersion time of the Cu film since the etching rate is vigorously changed with time, thereby making it difficult to obtain a Cu wiring having a desired line width. However, the slimming phenomenon as described above is not observed when the acetic acid-hydrogen peroxide based etching agent is used.

SUMMARY OF THE INVENTION

Accordingly, the object of the present invention carried out in view of the foregoing circumstances is to provide an etching agent that enables the Cu film to be etched by a simple chemical etching method such as a stationary immersion method for using a low resistance Cu film as a wiring material with little time dependent change of the etching rate, besides preventing the pattern slimming phenomenon caused by irregular amounts of etching at the side face of the Cu film (the amount of side etching).

In a first aspect, the present invention for solving the problems as hitherto described provides an etching agent for copper comprising an aqueous solution containing potassium hydrogen peroxomonosulfate.

According to the etching agent having such construction as described above, the Cu film may be etched by a simple chemical etching method such as a stationary immersion method, besides allowing a copper wiring with a desired line width since the etching rate shows no time-dependent changes of the etching rate, and the amount of side-etching of the Cu film is uniform.

The etching agent for copper as described above may contain acetic acid. The etching agent as described above shows no time-dependent changes of the etching rate, and the amount of side-etching of the Cu film is uniform besides being improved in wettability on the copper film, thereby enabling a copper wiring having an excellent dimensional accuracy to be formed even when a fine copper wiring is to be formed.

Preferably, the concentration of potassium hydrogen peroxomonosulfate falls within a range of 0.08 to 2.0 mol/l, more preferably within a range of 0.1 to 1.0 mol/l. When the concentration of potassium hydrogen peroxomonosulfate is less than 0.08 mol/l, only the copper film at the periphery of the mask pattern is so abnormally rapidly etched that the line width of the copper wiring obtained turns out to be narrower than the width of the mask pattern. When the concentration of potassium hydrogen peroxomonosulfate exceeds 2.0 mol/l, on the other hand, etching rate becomes too rapid and the line width of the copper wiring may be hardly controlled.

In accordance with another aspect of the present invention, the etching agent for a laminated film of a titanium film and a copper film comprises an aqueous solution containing potassium hydrogen peroxomonosulfate and hydrofluoric acid. According to the etching agent as described above, the side faces of the copper film constituting the laminated film may be uniformly etched besides enabling the titanium or titanium alloy film and the copper film to be collectively etched by a simple chemical etching method such as a stationary immersion method.

In one aspect, the etching agent for a laminated film of a molybdenum film and a copper film comprises an aqueous solution containing potassium hydrogen peroxomonosulfate, phosphoric acid and nitric acid. The side faces of the copper film constituting the laminated film can be uniformly etched using the etching agent as described above, besides allowing both of the molybdenum or molybdenum alloy film and the copper film to be collectively etched by a simple chemical etching method such as a stationary immersion method.

In another aspect, the etching agent for a laminated film of a chromium film and a copper film comprises an aqueous solution containing potassium hydrogen peroxomonosulfate and hydrochloric acid. The side faces of the copper film constituting the laminated film can be uniformly etched using the etching agent as described above, besides allowing both of the chromium or chromium alloy film and the copper film to be collectively etched by a simple chemical etching method such as a stationary immersion method.

The etching agent for a laminated film of a titanium film and a copper films may comprise an aqueous solution containing a peroxosulfate salt, hydrofluoric acid, and hydrochloric acid or a chloride. When the etching agent as described above is used for etching the laminated film of the titanium film and copper film, the lamination film can be collectively etched without leaving any etching residues besides enabling a laminated wiring to be precisely formed with a desired line width, thereby allowing the manufacturing process to be simple and the manufacturing yield to be improved.

When the Cl concentration (Cl$^-$ ion concentration) in the etching agent comprising an aqueous solution containing a peroxosulfate salt and hydrochloric acid or a chloride is increased, the etching rate is enhanced while reducing the amount of the etching residues. However, the upper limit of the Cl concentration is preferably about 10% because, when the Cl concentration is too large, the etching rate turns out to be so rapid that the etching rate may be hardly controlled.

The etching agent for a laminated film of a titanium film and a copper films may comprise an aqueous solution containing a potassium peroxosulfate salt and a fluoride. Since fluorine contained in the fluoride exists as F$^-$ ions in the aqueous solution when the etching agent as described above is used, the laminated film of the titanium or titanium alloy film and the copper film can be collectively etched without leaving any etching residues to allow a laminated wiring to be accurately formed with a desired line width, even when the etching agent does not contain HF. Therefore, the manufacturing process can be simplified besides improving the manufacturing yield. The etching agent may contain hydrofluoric acid.

The peroxosulfate salt to be used may comprise any one or more compounds selected from $KHSO_5$, $NaHSO_5$, $K_2S_2O_8$, $Na_2S_2O_8$ and $(NH_4)_2S_2O_8$.

Preferably, the chloride comprises an alkali metal chloride or ammonium chloride, examples of them being KCl, NaCl and $NH_4Cl$.

Preferably, the fluoride comprises an alkali metal fluoride or ammonium fluoride, examples of them being KF, NaF and $NH_4F$.

A preferable combination of the peroxosulfate salt and the chloride for making the etching agent to contain one kind of cation comprises, for example, the combination of $KHSO_5$ and KCl and the combination of $(NH_4)_2S_2O_8$ and $NH_4Cl$. A preferable combination of the peroxosulfate salt and the fluoride comprises, for example, the combination of $KHSO_5$ and KF, and the combination of $(NH_4)_2S_2O_8$ and $NH_4F$.

In accordance with a further aspect of the present invention, the present invention provides a method for manufacturing an electronic device substrate comprising the steps of: depositing a copper film on a substrate; forming a mask of a given pattern on the surface of the copper film; and etching the copper film using an etching agent, comprising an aqueous solution containing potassium hydrogen peroxomonosulfate and having any one of the constitutions described above, to form a copper wiring with a given pattern.

The method for manufacturing the electronic device substrate with constructions as described above has such advantages as making it possible to etch the Cu film by a simple chemical etching method such as a stationary immersion method. In addition, the time dependent change of the etching rate is small, and the side faces of the Cu film can be uniformly etched (the amount of side etching is uniform) to allow the copper wiring to be formed with a desired line width with good yield. Moreover, the manufacturing process is simple with an improved manufacturing efficiency. Accordingly, it is possible to obtain an electronic device substrate with low cost by improving the manufacturing yield according to the method for manufacturing the electronic device substrate having the constructions as described above.

In accordance with a different aspect, the present invention provides a method for manufacturing an electronic device substrate comprising the steps of: forming a mask with a given pattern on a laminated film prepared by sequentially depositing a titanium or a titanium alloy film and a copper film on a substrate; and etching the laminated film comprising the titanium or titanium alloy film and the copper film using the etching agent having any one of the constructions as described above according to the present invention to form a laminated wiring with a given pattern.

According to the method for manufacturing the electronic device substrate having the constructions as described above, the side faces of the copper film constituting the laminated film may be uniformly etched, and both of the titanium or titanium alloy film and the copper film constituting the laminated film may be collectively etched by a simple chemical etching method such as an immersion method. Therefore, the manufacturing yield becomes high and the manufacturing process may be shortened. Consequently, an electronic device substrate can be obtained with a low manufacturing cost according to the method for manufacturing the electronic device substrate having the constructions as described above by improving the manufacturing yield and manufacturing efficiency.

When an aqueous solution containing a peroxosulfate salt, hydrofluoric acid and hydrochloric acid or a chloride, or an aqueous solution containing a peroxosulfate salt and a fluoride is particularly used for the etching agent, the laminated film of the titanium or titanium alloy film and the copper film can be collectively etched without leaving any etching residues to allow a laminated wiring with a desired line width to be accurately formed, thereby making it possible to simplify the manufacturing process besides improving the manufacturing yield.

In a further different aspect, the present invention provides a method for manufacturing an electronic device substrate comprising at least a first metallic layer, a first insulation layer, a semiconductor layer, a second metallic layer and a second insulation layer, wherein the method for depositing at least one of the first and second metallic layers comprises the steps of: forming a mask of a given pattern on the surface of a laminated film prepared by sequentially depositing a titanium or titanium alloy film and a copper film; and etching the laminated film of the titanium or titanium alloy film and the copper film using an etching agent comprising an aqueous solution containing a peroxosulfate salt, hydrofluoric acid and hydrochloric acid or a chloride, or an etching agent comprising an aqueous solution containing a peroxosulfate salt and a fluoride, to form a laminated wiring with the given pattern as described above.

According to the method for manufacturing the electronic device substrate having the constructions as described above, the laminated film of the titanium or titanium alloy film and the copper film can be collectively etched without leaving any etching residues to enable a laminated wiring to be precisely formed with a desired line width, thereby allowing the manufacturing process to be simplified besides improving the manufacturing yield.

The semiconductor layer described above may be formed of polysilicon in the method for manufacturing the electronic device substrate.

The electronic device according to the present invention comprises a substrate manufactured by the method for manufacturing the electronic device substrate having any one of the foregoing constructions.

Since the electronic device having the constructions as described above is provided with a laminated wiring comprising copper films or a laminated wiring having a copper film as a low resistance wiring, decrease of signal voltages or signal retardation in the wiring ascribed to the wiring resistance is hardly caused, making it easy to construct a display device appropriate for large area display in which the wiring length is increased or for high precession display in which fine wiring is required.

DESCRIPTION OF THE PREFERRED EMBODIMENT

While the present invention is described in detail hereinafter with reference to the drawings, the present invention is not restricted to these embodiments.

First Embodiment

Figure 3:
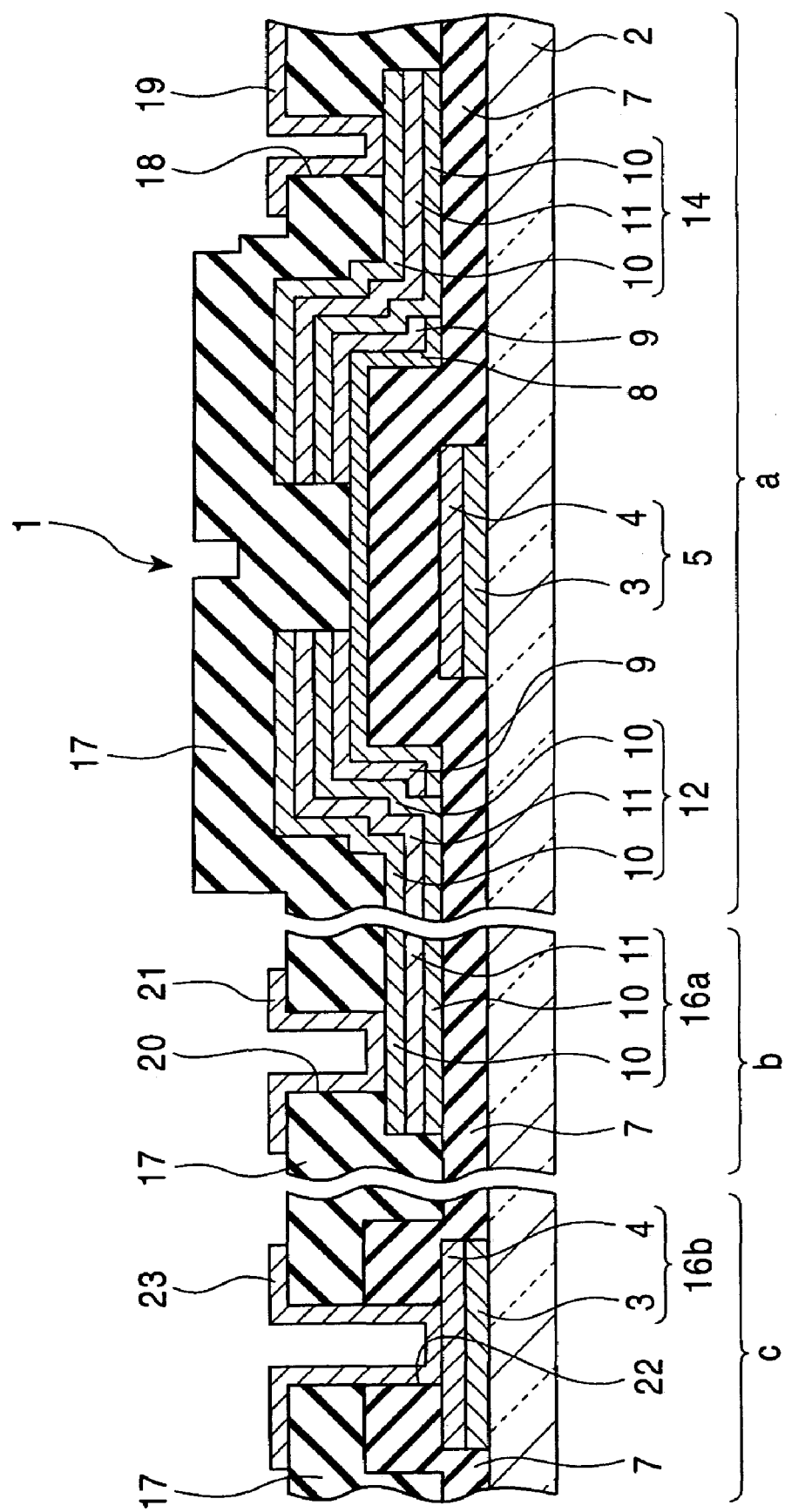
FIG. 3 shows a partial cross section of the thin film transistor substrate obtained in the first embodiment of the method for manufacturing the electronic device substrate according to the present invention.

FIG. 3 is a partial cross section showing an example of the thin film transistor substrate manufactured by applying the method for manufacturing the electronic device substrate according to the present invention to a method for manufacturing a thin film transistor substrate (the method for manufacturing the thin film transistor substrate according to the first embodiment) provided in a liquid crystal display device.

The portions with reference marks a, b and c denote a thin film transistor portion (TFT), a terminal portion of a source wiring located at outside of a TFT matrix and a terminal portion of a gate wiring, respectively. Although these three portions are located with some distances apart in the actual liquid crystal device provided with this thin film transistor substrate 1, and they can not be naturally exhibited simultaneously in the drawing, they are illustrated as if they are in adjacent relations one another for the convenience of illustration.

The thin film transistor portion a will be described first.

A gate electrode 5 comprising a Ti or Ti alloy film 3 with a film thickness of about 50 to 100 nm and a Cu film 4 with a film thickness of about 100 to 200 nm is provided on a substrate 2 of the thin film transistor portion a. A gate insulation film 7 is provided on the gate electrode 5, a semiconductor film 8 comprising an amorphous silicon (a-Si) is provided on the gate insulation film 7, a $n^+$-type a-Si layer 9 is provided on the semiconductor film 8, and a source electrode 12 and a drain electrode 14 are provided on the $n^+$-type a-Si layer 9. The source electrode 12 and the drain electrode 14 comprise a Ti or Ti alloy film 10 with a film thickness of about 50 to 100 nm, a Cu film 11 with a film thickness of 100 to 200 nm, and a Ti or Ti alloy film 10 with a film thickness of about 50 to 100 nm.

A passivation film (an insulation film) 17 covering the source electrode 12 and the drain electrode 14 is formed above them, and a contact hole 18 that reaches the Ti or Ti alloy film 10 provided above the copper film 11 is formed through the passivation film 17. Examples of the passivation film 17 include films of a(amorphous)-$SiN_x$:H, a-SiNx, a-$SiO_2$:H and $SiO_2$.

An ITO layer 19 to serve as a pixel electrode is formed along the inner wall face and bottom face of the contact hole 18. The drain electrode 14 is electrically connected to the ITO layer (the pixel electrode) 19 through the contact hole 18.

With respect to the terminal portion b of the source wiring, a lower pad layer 16a comprising the Ti or Ti alloy film 10, Cu film 11 and Ti or Ti alloy film 10 is formed on the gate insulation film 7, the passivation film 17 is formed on the lower pad layer 16a, and a contact hole 20 reaching the Ti or Ti alloy film 10 provided on the Al or Al alloy film 11 is formed.

An upper pad layer 21 comprising ITO is formed along the inner wall face and bottom face of the contact hole 20. The lower pad layer 16a is electrically connected to the upper pad layer 21 through the contact hole 20.

With respect to the terminal portion c of the gate wiring, a lower pad layer 16b comprising the Ti or Ti alloy film 3 and the Cu film 4 is formed on the substrate 2, the gate insulation film 7 is formed on the lower pad layer 16b, the passivation film 17 is further formed on the gate insulation film 7, and a contact hole 22 reaching the Cu film 4 is formed. An upper pad layer 23 comprising ITO is formed along the inner side wall face and bottom face of the contact hole 22. The lower pad layer 16b is electrically connected to an upper pad layer 23 through the contact hole 22.

The method for manufacturing the thin film transistor substrate in the first embodiment according to the present invention will be described hereinafter with reference to FIGS. 1A to 1D and FIGS. 2A and 2B.

In FIGS. 1A to 1D and FIGS. 2A and B, the portions with reference marks a, b and c denote a thin film transistor (TFT) part, a terminal portion of a source wiring located at outside of a TFT matrix, and a terminal portion of a gate wiring, respectively.

As shown in FIGS. 1A to 1D, a lamination film is formed by sequentially depositing a Ti or Ti alloy film 3 and a Cu film 4 on a substrate 2.

Figure 1A:
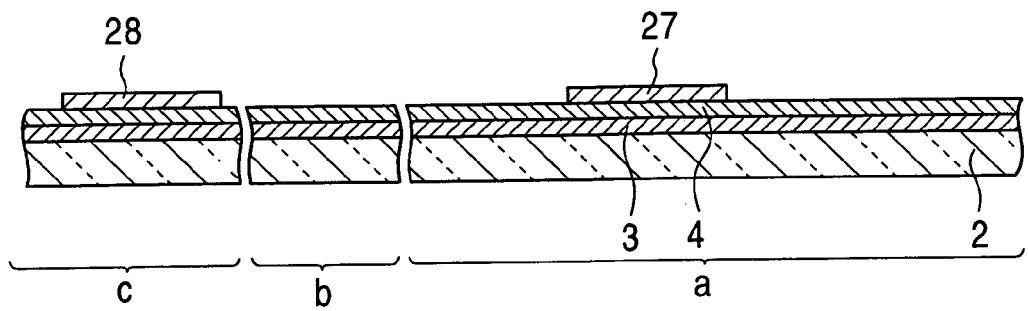
FIG. 1A illustrates the first step of the method for manufacturing the thin film transistor substrate in the first embodiment of the method for manufacturing the electronic device substrate according to the present invention.
Figure 1B:
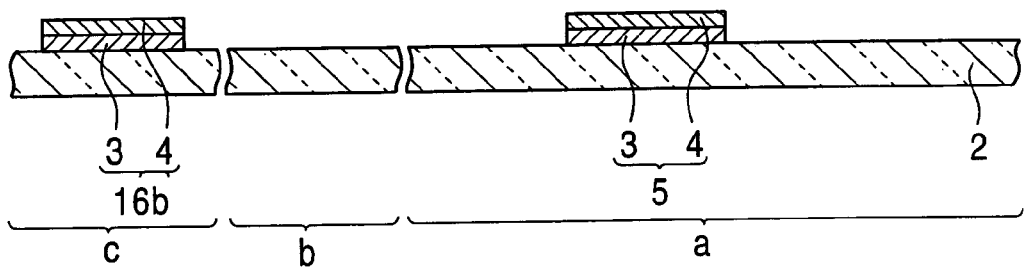
FIG. 1B illustrates the second step of the method for manufacturing the thin film transistor substrate in the first embodiment of the method for manufacturing the electronic device substrate according to the present invention.

With respect to the thin film transistor portion a, after forming a mask pattern 27 with a given pattern by a photolithographic method on the Cu film 4 constituting the laminated film, the laminated film is collectively etched using an etching agent comprising potassium hydrogen peroxomonosulfate ($KHSO_5$) and hydrofluoric acid to form a gate electrode 5 comprising the Ti alloy film 3 and the Cu film 4 as shown in FIG. 1B. The concentration of potassium hydrogen peroxosulfate in the etching agent used herein is preferably within the range of 0.08 to 2.0 mol/l. It is also preferable that the concentration of hydrofluoric acid relative to potassium hydrogen peroxosulfate in the etching agent is adjusted to be within the range of 0.05 to 2.0 mol/l, in order to enable respective metallic films constituting the laminated film to be etched with approximately the same etching rate in one etching run. The etching agent preferably contains acetic acid in order to improve wettability against the laminated film, wherein the weight ration of acetic acid relative to potassium hydrogen peroxosulfate is preferably adjusted to be within the range of 10 to 75% by weight.

With respect to the terminal portion c of the gate wiring, the lower pad 16b comprising the Ti or Ti alloy film 3 and Cu film 4 as shown in FIG. 1B is formed, after forming a mask pattern 28 with a given pattern by photolithography on the Cu film 4 constituting the laminated film, by collectively etching the laminated film using the same etching agent as used in the foregoing example.

The method as described above allows the side face of the Cu film 4 constituting the laminated film to be uniformly etched besides enabling both of the Ti or Ti alloy film 3 and the Cu film 4 to be simultaneously etched by a simple chemical etching method such as a stationary immersion method.

Figure 1C:
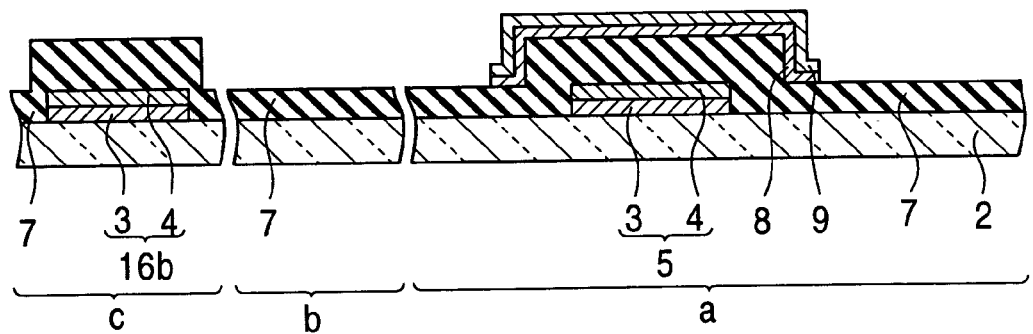
FIG. 1C illustrates the third step of the method for manufacturing the thin film transistor substrate in the first embodiment of the method for manufacturing the electronic device substrate according to the present invention.

Then, the gate insulation film 7 is formed over the entire surface of the substrate 2 using a CVD method. With respect to the thin film transistor portion a, the semiconductor layer 8 and $n^+$-type a-Si layer 9 are formed, followed by etching the semiconductor layer 8 and $n^+$-type a-Si layer 9 as shown in FIG. 1C so as to leave the upper portion of gate electrode 5 that serves as a channel portion of the TFT behind.

Figure 1D:
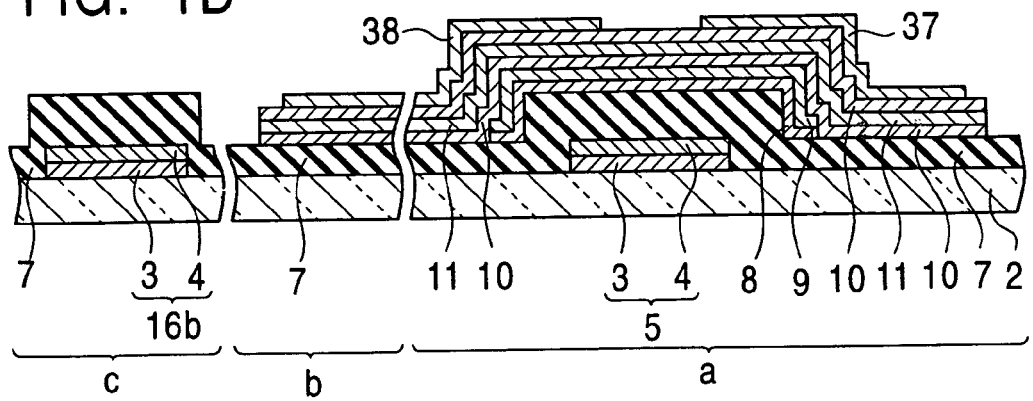
FIG. 1D illustrates the fourth step of the method for manufacturing the thin film transistor substrate in the first embodiment of the method for manufacturing the electronic device substrate according to the present invention.

With respect to the thin layer transistor portion a and the terminal portion b of the source wiring, a laminated film is formed by sequentially laminating the Ti or Ti alloy film 10, the Cu film 11 and the Ti or Ti alloy film 10 as shown in FIG. 1D.

Figure 2A:
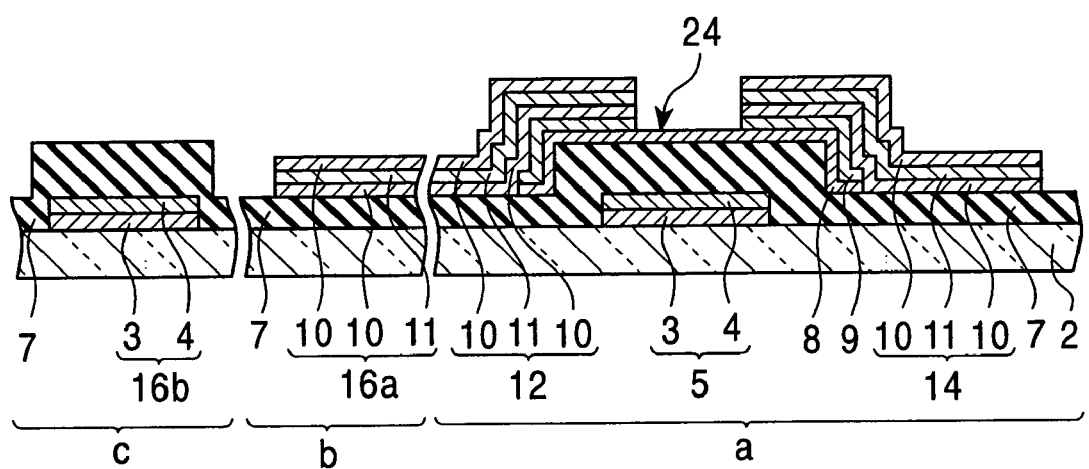
FIG. 2A illustrates the first step of the method for manufacturing the thin film transistor substrate in the first embodiment of the method for manufacturing the electronic device substrate according to the present invention.

With respect to the thin film transistor portion a, a mask pattern 37 with a give pattern is formed on the Ti or Ti alloy film 10 in the laminated film located at above the gate electrode 5 that serves as a channel part of the TFT by photolithography, followed by forming the source electrode 12 comprising the Ti or Ti alloy film 10, the Cu film 11 and the Ti or Ti alloy film 10 as shown in FIG. 2A, and the drain electrode 14 by collectively etching the laminated film using the same etching agent as used in the foregoing example.

With respect to the terminal portion b of the source wiring, a mask pattern 38 with a given pattern is formed on the Ti or Ti alloy film 10 of the laminated film by photolithography, followed by collectively etching the laminated film using the same etching agent as used in the foregoing example to form the lower pad layer 16a comprising the Ti or Ti alloy film 10, the Cu film 11 and the Ti or Ti alloy film 10 as shown in FIG. 2A.

The method as described above allows the amount of side etching of the Cu film 11 constituting the laminated film to be uniform, besides allowing the Cu film 11 as well as the Ti or Ti alloy film 10 on the upper and lower face of the Cu film to be simultaneously etched by a simple chemical etching method such as a stationary immersion method.

The channel 24 is formed thereafter by etching the n$^+$-type a-Si layer 9 using a dry method or using a dry method and wet method together.

With respect to the thin film transistor portion a, the terminal portion b of the source wiring and the terminal portion c of the gate wiring, the passivation film 17 is formed on the Ti or Ti alloy films 3 and 10.

Figure 2B:
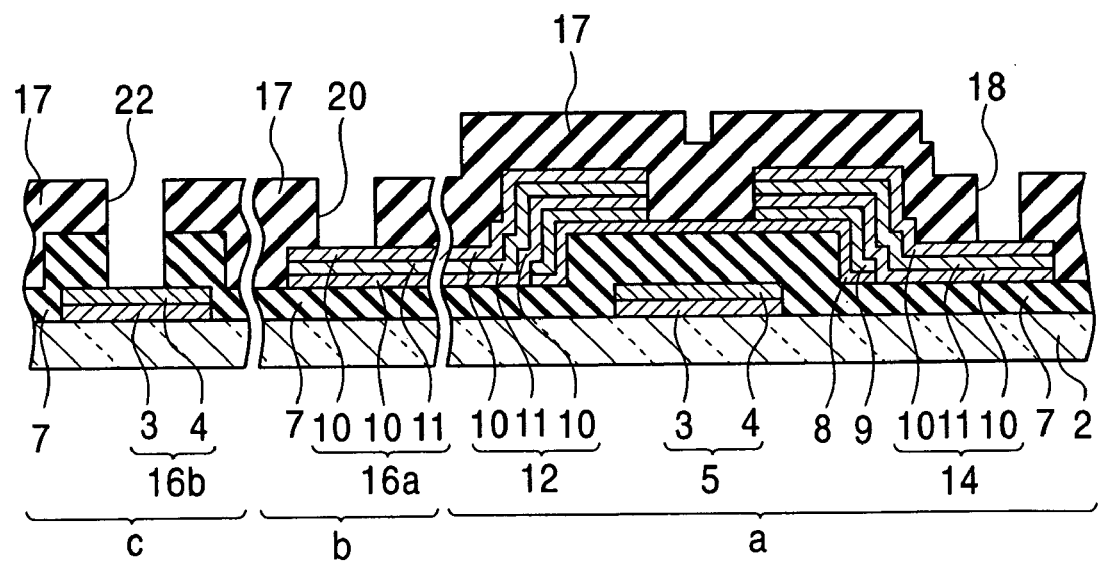
FIG. 2B illustrates the second step of the method for manufacturing the thin film transistor substrate in the first embodiment of the method for manufacturing the electronic device substrate according to the present invention.

With respect to the thin film transistor portion a, the contact hole 18 is formed through the passivation film 17 by the dry method or by using the dry method and wet method together as shown in FIG. 2B, followed by forming the ITO layer 19 on the bottom face and inner wall face of the contact hole 18 up to on the upper face of the passivation film 17 as shown in FIG. 3 by patterning after forming the ITO layer over the entire surfaces.

Similarly with respect to the terminal portion b of the source wiring and the terminal portion c of the gate wiring, the contact holes 20 and 22 are formed by etching the passivation film 17 by the dry method or using the dry method and wet method together (the contact hole 22 is formed in the terminal portion c of the gate wiring by etching the passivation film 17 as well as the gate insulation film 7), followed by forming the upper pad layers 21 and 23 on the bottom faces and inner wall faces of the contact holes 20 and 22 up to on the upper face of the passivation film 17 by patterning after forming the ITO layer over the entire surface. The thin film transistor substrate 1 as shown in FIG. 3 is manufactured by the procedure as described above.

In the method for manufacturing the thin film transistor substrate according to the first embodiment, the side faces of the copper films 4 and 11 constituting the laminated film can be uniformly etched by using an etching agent comprising an aqueous solution containing potassium hydrogen peroxosulfate (KHSO$_5$) and hydrofluoric acid, when the gate electrode 5, the source electrode 12, the drain electrode 14 and the lower pad layers 16a and 16b are formed by etching the laminated film formed by sequentially depositing the Ti or Ti alloy film 3 and the Cu film 4, and the laminated film formed by depositing the Ti or Ti alloy films 10 on the upper and lower faces of the Cu film 11. Moreover, since both of the Ti or Ti alloy film 3 and the copper film 4 constituting the laminated film can be collectively etched by a simple chemical etching method such as a stationary immersion method, or the Cu film 11 and the Ti or Ti alloy films 10 formed on the upper and lower faces of the copper film can be simultaneously etched when the laminated film comprises three layers, a good manufacturing yield can be obtained and the manufacturing process can be shortened. According to the method for manufacturing the thin film transistor in the first embodiment having the constructions as hitherto described, a low cost thin film transistor can be obtained by improving the manufacturing yield and the manufacturing efficiency.

Diffusion of elements into the laminated film may be blocked by the Ti or Ti alloy film even when the elements diffuse from adjoining films at the lower side of the laminated film, because the Ti or Ti alloy film is used at the lower layer of the copper film, thereby allowing increase of the wiring resistance ascribed to diffusion of the elements from the adjoining films to be prevented. For example, when the substrate 2 is made of a glass, Si in the glass substrate is prevented from invading into the copper film 4 for forming the gate electrode 5 and the lower pad layer 16b, thereby preventing increase of the wiring resistance ascribed to invasion of Si into the copper film 4.

Since the laminated film in which the Ti or Ti alloy film 10 is provided as an upper layer of the copper film 11 is used, anti-oxidative property against moisture and oxygen in the air, and corrosion resistance against a resist peeling solution may be improved. Consequently, the source electrode 12, the drain electrode 14 and the lower pad layer 16a are hardly damaged, enabling peeling of these electrodes 12 and 14 and the lower pad layer 16a from the substrate, as well as occurrence of malfunctioning such as wiring breakage, to be prevented. In addition, since Cu atoms in the copper layer 11 are blocked from diffusing into the adjoining films by the Ti or Ti alloy film 10, poor insulation resistance ascribed to diffusion of the Cu atoms from the copper layer 11 as well as deterioration of characteristics of the semiconductor active films can be prevented. Diffusion of the elements from the adjoining films at above the laminated film into the electrodes 12 and 14 and the lower pad layer 16a can be also blocked by the Ti or Ti alloy film 10, thereby allowing increase of the wiring resistance ascribed to diffusion of the elements from the adjoining films to be prevented.

The technical scope of the present invention is not restricted to the embodiment as hitherto described, but various modifications with respect to the film thickness of the Cu film, the Ti or Ti alloy film, and the passivation film, and their shapes, are possible within a range not departing from the spirit of the present invention.

While the gate electrode 5 and the lower pad layer 16b have been formed by collectively etching together with the Ti or Ti alloy film 3 and the Cu film 4 in the foregoing embodiment, a three-layered film comprising the Ti or Ti alloy films formed on the upper and lower faces of the Cu film may be collectively etched.

While the source electrode 12, the drain electrode 14 and the lower pad layer 16a have been formed by collectively etching the three-layered laminated film comprising the Ti or Ti alloy films formed on the upper and lower faces of the Cu film, they may be formed by collectively etching the two-layered laminated film in which the Cu film is formed on the Ti or Ti alloy film.

While an aqueous solution containing potassium hydrogen peroxosulfate and hydrofluoric acid has been used as the etching agent for the laminated film in the foregoing embodiment, only the Cu film can be selectively etched by etching the laminated film using an etching agent comprising an aqueous solution containing potassium hydrogen peroxosulfate, wherein the etching treatment may be applied using an etching agent for the Ti or Ti alloy film prior or after etching the Cu film.

An aqueous solution containing a peroxosulfate salt, hydrofluoric acid, and hydrochloric acid or a chloride, or an aqueous solution containing a peroxosulfate salt and a fluoride may be used as the etching agent for the laminated film comprising the Ti or Ti alloy film and the Cu film, instead of using the aqueous solution containing hydrogen potassium peroxosulfate and hydrofluoric acid as described above. Using such etching agents allows the laminated film to be collectively etched without leaving any etching residues while enabling the laminated wiring to be precisely formed with a desired line width, thereby making it possible to simplify the manufacturing process besides improving the manufacturing yield.

Second Embodiment

The method for manufacturing the thin film transistor substrate according to the second embodiment of the present invention will be described hereinafter.

The method for manufacturing the thin film transistor substrate according to the second embodiment differs from the method for manufacturing the thin film transistor substrate according to the first embodiment in that a laminated film of a Mo or Mo alloy film and Cu film is formed for the laminated film for forming the gate electrode 5 and the lower pad layer 16b, and a laminated film provided with the Mo or Mo alloy films on the upper and lower faces of the Cu film is formed for forming the source electrode 12, the drain electrode 14 and the lower pad layer 16a. An aqueous solution containing potassium hydrogen peroxomonosulfate, phosphoric acid and nitric acid is used for the etching agent for these laminated films.

It is preferable for allowing respective metallic films constituting the laminated film to be etched in one etching run with approximately the same etching rate as one another, that the concentration of phosphoric acid in the etching agent relative to hydrogen potassium peroxosulfate is adjusted to be within the range of 0.8 to 8 mol/l, and the concentration of nitric acid relative to hydrogen potassium peroxosulfate is adjusted to be within the range of 0.1 to 1.0 mol/l.

In the method for manufacturing the thin film transistor substrate according to the second embodiment, the etching agent comprising the aqueous solution containing hydrogen potassium peroxosulfate, phosphoric acid and nitric acid is used for etching the laminated film prepared by sequentially depositing the Mo or Mo alloy film and the Cu film, or the laminated film prepared by depositing the Mo or Mo alloy films on the upper and lower faces of the Cu film, to form the gate electrode 5, the source electrode 12, the drain electrode 14, and the lower pad layers 16a and 16b with given patterns. As a result, the side faces of the copper film constituting respective laminated films may be uniformly etched, besides enabling both of the Mo or Mo alloy film and the copper film constituting the laminated film to be collectively etched by a simple chemical etching method such as a stationary immersion method. The Cu film and the Mo or Mo alloy film sandwiching the Cu film can be simultaneously etched when the laminated film comprises a three-layered structure, enabling the manufacturing yield to be good and the manufacturing process to be shortened.

Third Embodiment

The method for manufacturing the thin film transistor substrate according to the third embodiment of the present invention will be described hereinafter.

The method for manufacturing the thin film transistor substrate according to the third embodiment differs from the method for manufacturing the thin film transistor substrate according to the first embodiment in that a laminated film of a Cr or Cr alloy film and the Cu film is formed for the laminated film for forming the gate electrode 5 and the lower pad layer 16b, a laminated film of a Cr or Cr alloy film and the Cu film is formed for the laminated film for forming the source electrode 12, the drain electrode 14 and the lower pad layer 16a. An etching agent comprising an aqueous solution containing hydrogen potassium peroxosulfate and hydrochloric acid is used for etching these laminated films.

It is preferable for allowing respective metallic films constituting the laminated film to be etched at approximately the same etching rate in one etching run, that the concentration of hydrochloric acid relative to hydrogen potassium peroxosulfate in the etching agent is adjusted to be within the range of 4 to 11 mol/l. When the substrate 2 on which the laminated film has been formed is immersed in the etching agent for etching the laminated film, the Cu film constituting the laminated film is effectively etched with hydrogen potassium peroxosulfate at the area not masked with a mask pattern, and Cu in the Cu film reacts with hydrochloric acid, thereby enabling the Cr or Cr alloy film under the Cu film to be effectively etched while forming bubbles.

When the gate electrode 5, the source electrode 12, the drain electrode 14, and the lower pad layer 16a and 16b with given patterns are formed by etching a laminated film prepared by sequentially depositing Cr or Cr alloy films and Cu films in the method for manufacturing the thin film transistor substrate according to the third embodiment of the present invention, the side faces of the copper film constituting respective laminated films can be uniformly etched by using an etching agent comprising an aqueous solution containing potassium hydrogen peroxosulfate and hydrochloric acid. Moreover, since both of the Cr or Cr alloy film and the copper film constituting the laminated film can be collectively etched by a simple chemical etching method such as an immersion method, a good production yield as well as a short manufacturing process can be attained.

While the method for etching the laminated film comprising the Ti or Ti alloy film and the Cu film, the laminated film comprising the Mo or Mo alloy film and the Cu film, and the laminated film comprising the Cr or Cr alloy film and the Cu film have been described in the foregoing first to third embodiments, the Cu film can be selectively etched by using an aqueous solution containing potassium hydrogen peroxosulfate as an etching agent for etching the laminated film comprising the W or W alloy film and the Cu film, the laminated film comprising the Ta or the Ta alloy film such as TaN film and the Cu film, the laminated film comprising the TiN film an the Cu film, and the laminated film comprising the $TiO_x$ film and the Cu film. Otherwise, when an aqueous solution containing potassium hydrogen peroxosulfate is used as an etching agent for etching the laminated film comprising the Mo film and the Cu film, it is possible to simultaneously etch the Mo film and the Cu film, although the etching rate of the Mo film is smaller than the etching rate of the Cu film.

Fourth Embodiment

The method for manufacturing the thin film transistor substrate according to the fourth embodiment of the present invention will be described hereinafter.

Figure 4:
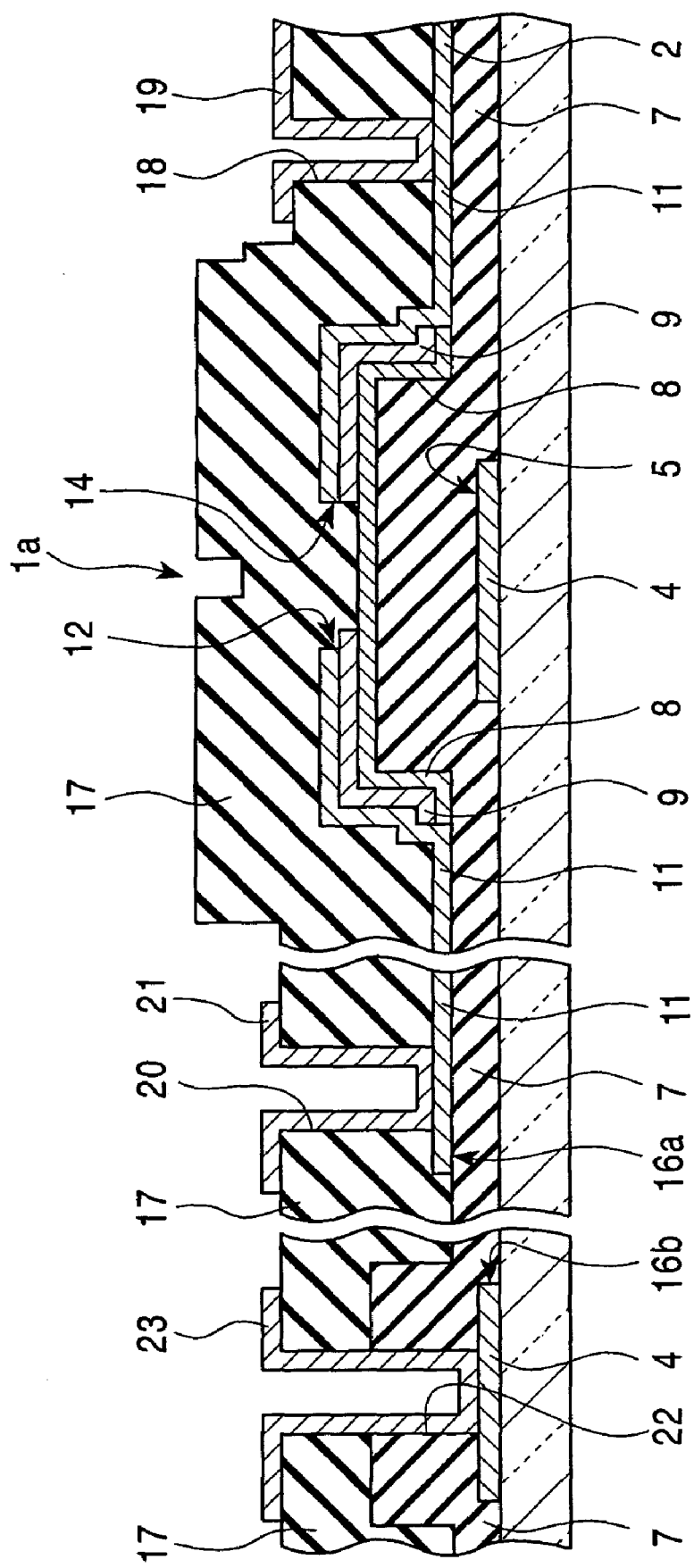
FIG. 4 shows a partial cross section of the thin film transistor substrate manufactured in the fourth embodiment of the method for manufacturing the thin film transistor substrate according to the present invention.

FIG. 4 is a partial cross section illustrating an example of the thin film transistor substrate manufactured by the method for manufacturing the thin film transistor substrate according to the fourth embodiment of the present invention. This thin film transistor substrate 1a differs from the thin film transistor substrate 1 shown in FIG. 3 in that the gate electrode 5 and the lower pad layer 16b are composed of the Cu film 4, and the source electrode 12, the drain electrode 14 and the lower pad layer 16a are also composed of the Cu film 11.

The method for manufacturing the thin film transistor substrate according to the fourth embodiment differs from the method for manufacturing the thin film transistor substrate according to the first embodiment in that the Cu film 4 is formed for the gate electrode 5 and lower pad layer 16b, and the Cu film 11 is formed for the drain electrode 14 and lower pad layer 16a. An aqueous solution containing potassium hydrogen peroxosulfate is used as an etching agent for these Cu films 4 and 11.

The preferable concentration of potassium hydrogen peroxosulfate in the etching agent to be used herein is within the range of 0.08 to 2.0 mol/l. It is preferable that the etching agent contains acetic acid for improving wettability on the Cu film, and the weight ratio of acetic acid in the etching agent relative to potassium hydrogen peroxosulfate is preferably adjusted within the range of 10 to 75% by weight.

When the gate electrode 5, the source electrode 12, the drain electrode 14, and the lower pad layers 16a and 16b with given patterns are formed by etching the Cu films 4 and 11 formed on the substrate 2 in the method for manufacturing the thin film transistor substrate according to the fourth embodiment, an aqueous solution containing potassium hydrogen peroxosulfate is used as an etching agent. As a result, the Cu films 4 and 11 can be etched by a simple chemical etching method such as a stationary immersion method. Moreover, the time-dependent changes of the etching rate is small and the side faces of the Cu films 4 and 11 are uniformly etched to enable the gate electrode 5, the source electrode 12, the drain electrode 14, and the lower pads 16a and 16b to be formed with desired line width, thereby a good manufacturing yield and a simple manufacturing process can be attained to improve the manufacturing efficiency. A low cost thin film transistor substrate is therefore obtained by improving the manufacturing yield using the method for manufacturing the thin film transistor substrate according to the fourth embodiment having the constructions as hitherto described.

Fifth Embodiment

Figure 11:
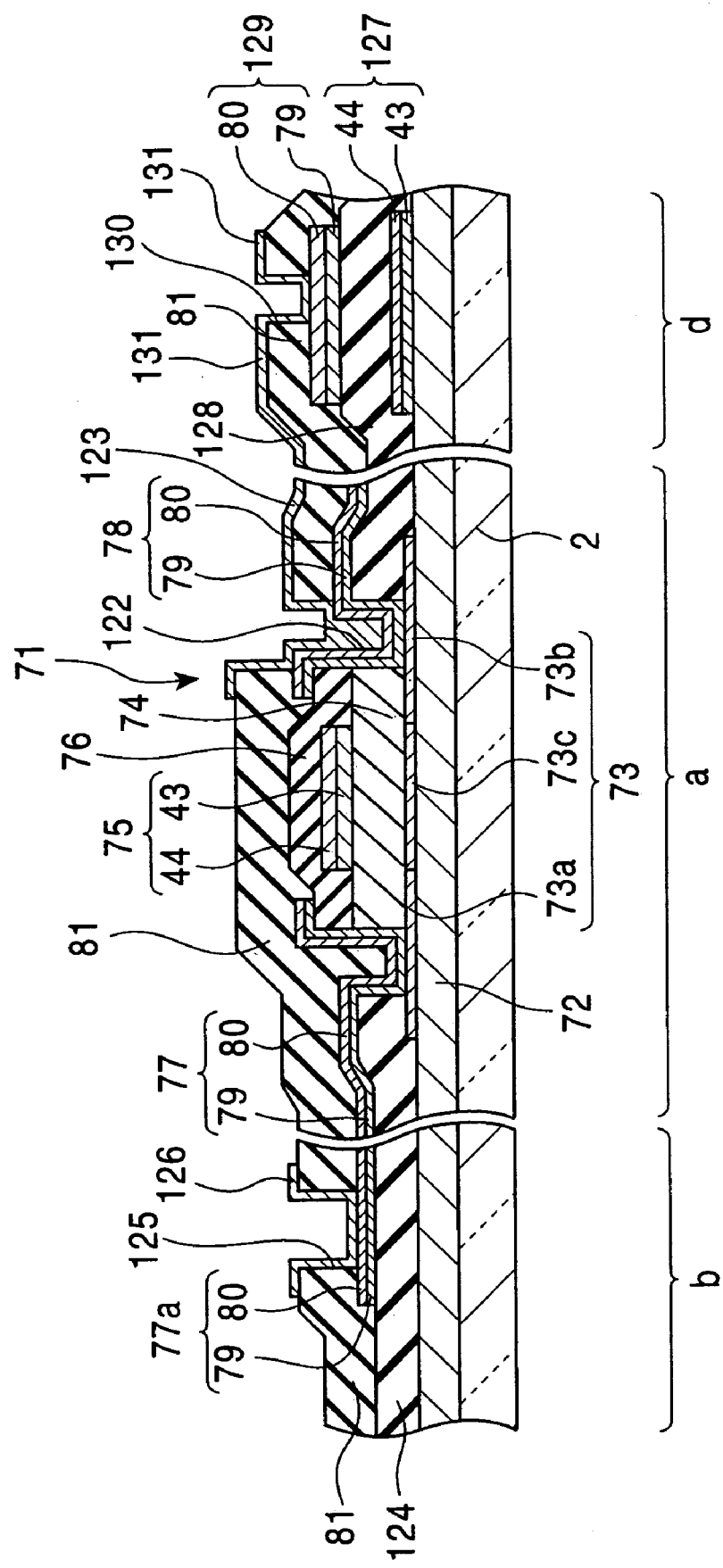
FIG. 11 shows a partial cross section of the thin film transistor substrate obtained by the method for manufacturing the electronic device substrate according to the fourth embodiment of the present invention.

FIG. 11 shows a partial cross section of the thin film transistor substrate obtained by the method for manufacturing the electronic device substrate according to the fifth embodiment of the present invention.

The reference mark a, b and c denote a thin film transistor (TFT) part, a terminal portion (a pad portion) of a source wiring and a capacitor portion (a Cs portion), respectively. While these three portions are actually located with some distances apart one another, they are illustrated as if they are in adjacent relations one another for the convenience of illustration.

The thin film transistor portion a will be described first.

A semiconductor layer 73 comprising polysilicon is formed on the substrate 2 via an insulation layer 72 in the thin film transistor portion a. A gate insulation film 74 is formed on the center of the semiconductor layer, and a gate electrode (a first metallic layer) 75 is provided on the gate insulation film 74. The gate electrode 75 is composed of a Ti or Ti alloy film 43 with a film thickness of 50 to 100 nm and a Cu or Cu alloy film 44 with a film thickness of 100 to 200 nm. The gate electrode 75 is integrated with a gate wiring (not shown), and an interlayer insulation film (a first insulation layer) 76 is provided on the gate electrode 75.

A source area 73a and a drain area 73b are formed in the semiconductor layer 73, and the portion sandwiched with these source area 73a and drain area 73b serves as a channel portion 73c. The semiconductor layer constituting these source area 73a and drain area 73b is formed so as to penetrate under the gate insulation film 74.

A source wiring (a second metallic layer) 77 is formed on the source area 73a, and a drain electrode (a second metallic area) 78 is formed on the drain area 73b. These source wiring 77 and drain electrode 78 are composed of a Ti or Ti alloy film 79 with a film thickness of 50 to 100 nm and a Cu or Cu alloy film with a film thickness of 100 to 200 nm.

A passivation film 81 is formed so as to cover the entire surface, a contact hole 122 perforating through the passivation film 81 to reach the drain electrode 78 is formed, and a pixel electrode 123 comprising ITO connected to the drain electrode 78 through the contact hole 122 is formed.

A passivation film 81 covering the gate wiring is open, similar to the contact hole, at the gate terminal portion at the end of the gate wiring connected to the gate electrode 75, although their illustration is omitted, and pads comprising ITO are provided to be in electrical continuity with the gate wiring.

With respect to the terminal portion b of the source wiring 77, an interlayer insulation film (a second insulation film) 124 is formed on the insulation layer 72 formed on the substrate 2, a lower pad layer 77a comprising a Ti or Ti alloy film 79 and a Cu film 80 is formed on the interlayer insulation film 124, the passivation film 81 is formed on the lower pad, and a contact hole reaching the lower pad layer 77a is formed.

An upper pad layer 126 comprising ITO is formed along the inner wall face and bottom face of the contact hole 125. The lower pad layer 77a is electrically connected to an upper pad layer 126 through this contact hole 125.

With respect to the capacitor portion d, a capacitor line (a first metallic line) 127 comprising the Ti or Ti alloy film 43 and the Cu film 44 is formed on the substrate 2 via the insulation layer 72, an interlayer insulation film (a second insulation film) 128 is formed on the capacitor line, a capacitor electrode (a second metallic film) 129 comprising a Ti or Ti alloy film 79 and a Cu film 80 is further formed on the capacitor line, and the passivation film 81 is additionally formed on the capacitor electrode to form a contact hole 130 reaching the capacitor electrode 129. A layer 131 comprising ITO is formed along the inner wall face and bottom face of the contact hole 130. The layer 131 is electrically connected to the capacitor electrode 129 through the contact hole 130.

While the gate electrode (the first metallic layer) 75 and the capacitor line (a first metallic layer) 127 provided in the electronic device substrate 71 as shown in FIG. 11 are formed by a sputtering method or photolithographic method, the gate electrode (the first metallic layer) 75 and the capacitor line (the first metallic layer) 127 can be obtained by forming a mask with a given pattern on the surface of the laminated film prepared by sequentially depositing the Ti or Ti alloy film 43 and the Cu film 44, followed by etching the laminated film comprising the Ti or Ti alloy film 43 and the Cu film 44 using an etching agent comprising an aqueous solution containing a peroxosulfuric acid salt, hydrofluoric acid, and hydrochloric acid or a chloride, or comprising an aqueous solution containing a peroxosulfuric acid salt and a fluoride.

While the source wiring (the second metallic layer) 77, the drain electrode (the second metallic layer) 78, the lower pad layer (the second metallic layer) 77a and the capacitor electrode (the second metallic layer) 129 are formed by a sputtering method and a photolithographic method, the source wiring (the second metallic layer) 77, the drain electrode (the second metallic layer) 78, pad layer (the second metallic layer) 77a and the capacitor electrode (the second metallic layer) 129 are formed by forming a mask with a given pattern on the surface of the laminated film prepared by sequentially depositing the Ti or Ti alloy film 79 and the Cu film 80, followed by etching the laminated film comprising the Ti or Ti alloy film 79 and the Cu film 80 using an etching agent comprising an aqueous solution containing a peroxosulfate salt, hydrofluoric acid, and hydrochloric acid or a chloride, or comprising an aqueous solution containing a peroxosulfate salt and a fluoride.

According to the method for manufacturing the electronic device substrate in the fifth embodiment, the laminated film comprising the Ti or Ti alloy film 43 and the Cu film 44, or the laminated film comprising the Ti or Ti alloy film 79 and the Cu film 80, can be collectively etched without leaving any etching residues to make it possible to accurately form the desired gate electrode (the first metallic layer) 75, the capacitor line (the first metallic layer) 127, the source wiring (the second metallic layer) 77, the drain electrode (the second metallic layer) 78, pad layer (the second metallic layer) 77a and the capacitor electrode (the second metallic layer) 129, thereby allowing the manufacturing process to be simplified besides improving the manufacturing yield.

Figure 5:
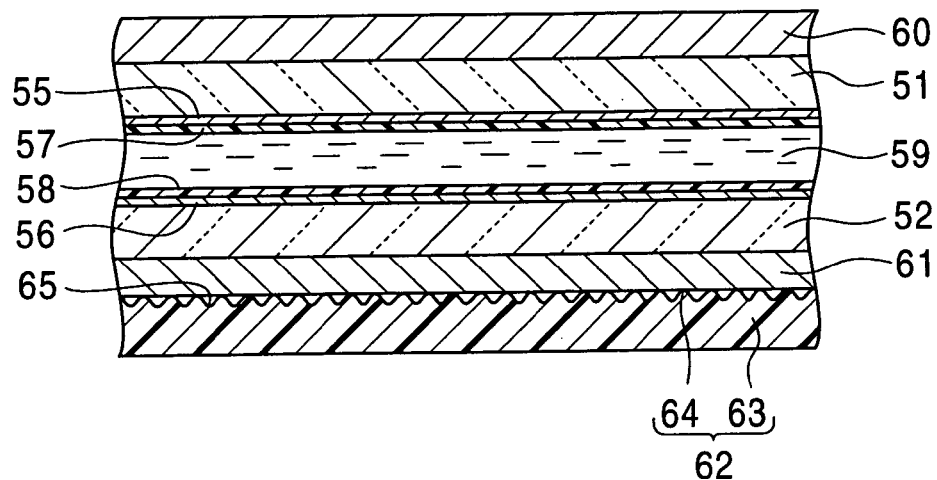
FIG. 5 shows an illustrative drawing of one example of the reflection type liquid crystal display having the thin film transistor substrate manufactured by the method for manufacturing the thin film transistor substrate in any of the first to fifth embodiments according to the present invention.

FIG. 5 is an illustrative drawing showing one example of a reflection type liquid crystal display device provided with the thin film transistor substrate manufactured by the method for manufacturing the thin film transistor substrate according to the embodiment in the present invention.

In the reflection type liquid crystal display device (an electronic equipment), an upper transparent electrode layer 55 and an upper orientation film 57 are provided at the inner face side of an upper glass substrate 51 of upper and lower side glass substrates 51 and 52, which are in opposed relation one another by sandwiching a liquid crystal layer 59, in the order from an upper glass substrate 51 side, and a lower transparent electrode layer 56 and a lower orientation film 58 are provided at the inner face side of the lower glass substrate 52 in the order from the lower glass substrate 52.

The liquid crystal layer 59 is disposed between the upper orientation film 57 and the lower orientation film 58. An upper polarizer 60 is provided at the outer face side of the upper glass substrate 51, and a lower side polarizer 61 is provided at the outer face side of the lower side glass substrate 52. A reflection plate 62 is attached to the outer surface of the lower polarizer 61 with a rough surface 65 of its reflection film 64 toward the lower side polarizer 61. The reflection plate 62 is formed, for example, by depositing the metallic reflection film 64 comprising Al or silver on the rough surface of a polyester film 63 on the surface of which a randomly rough surface is formed, which comprises a randomly rough face 65 on the surface.

The lower glass substrate 52 corresponds to the substrate 2, and the lower transparent electrode layer 56 corresponds to the ITO layer (the pixel electrode) 19, of the thin film transistor substrate manufactured by applying the method for manufacturing the thin film transistor substrate according to any one of the first to fifth embodiments.

Since the thin film transistor substrate 1a using the copper wiring as the low resistance wiring, or the thin film transistor substrate 1 using the laminated wiring comprising the copper film, is provided in the reflection type liquid crystal display device, decrease of signal voltages and wiring retardation of signals ascribed to the wiring resistance are hardly caused, providing such advantages as readily realizing a display device that is most suitable for a large area display that requires an long extension of wiring or a high-precision display that forces fine wiring.

EXAMPLES

Although the present invention is described in more detail with reference to the examples, the present invention is not restricted merely by these examples.

Example 1

An aqueous solution of Oxon (trade name, made by Aldrich Co., an aqueous solution containing 2 $KHSO_5.KHSO_4.K_2SO_4$) and an aqueous solution of ammonium peroxosulfate (($NH_4)_2S_2O_8$) were prepared as an etching agent, and the mole concentration dependency of the etching rate of Cu when the Cu film is etched using each etching agent was studied as follows.

Test pieces prepared by forming a Cu film with a film thickness of 300 nm on a glass substrate were manufactured, and the etching rates when these test pieces were etched using the etching agents in which mole concentrations are changed were determined. The results are shown in FIG. 6.

Figure 6:
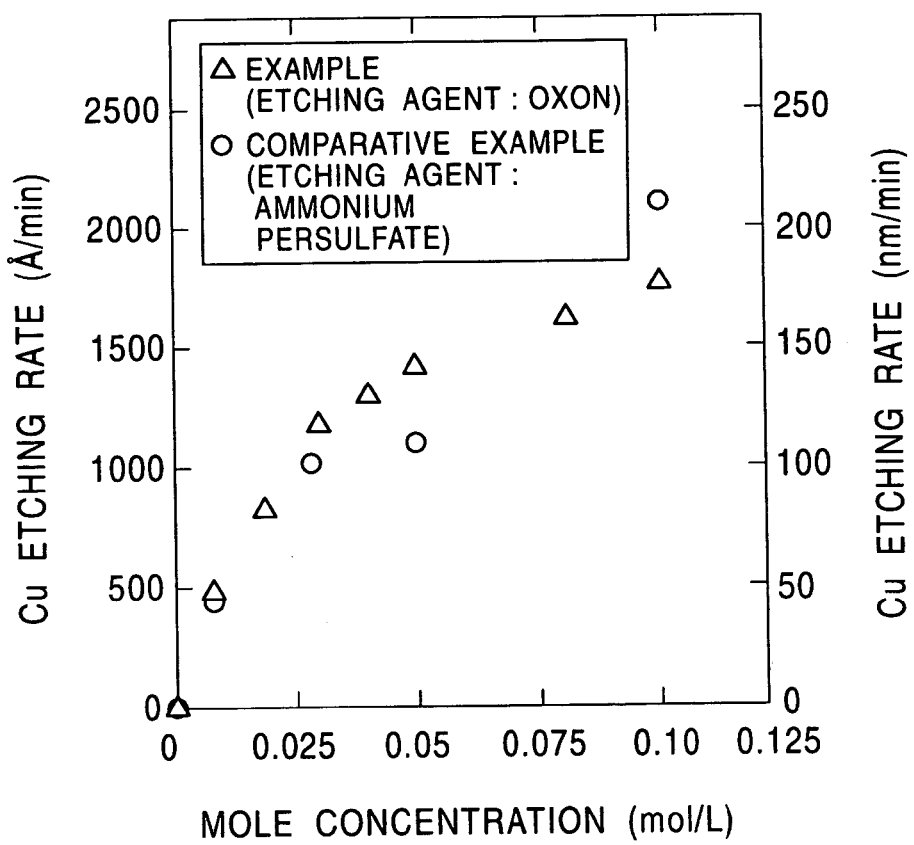
FIG. 6 shows the mole concentration dependency of the etching rate of Cu when the Cu film is etched using the etching agent in the example and in the comparative example.

The results shown in FIG. 6 show that, since approximately the same result is obtained between the etching rate using the etching agent comprising Oxon and the etching rate using the etching agent of the comparative example comprising the aqueous solution of ammonium peroxosulfate, the etching agent in the example can be used for the etching agent of the Cu film.

Example 2

Figure 7:
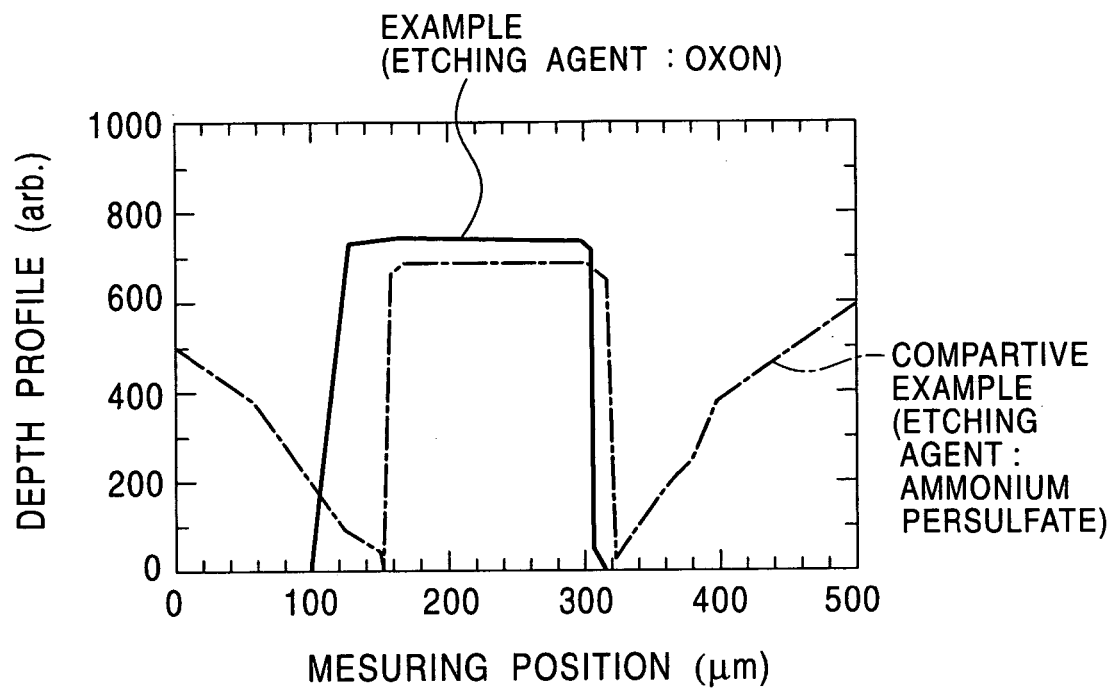
FIG. 7 shows the film thickness distribution of the Cu film when the Cu film is etched using the etching agent in the example and in the comparative example.

The etching agent in the example comprising the aqueous Oxon solution used in Example 1, and the etching agent in the comparative example comprising the aqueous ammonium peroxosulfate solution were prepared, and the film thickness distribution of the Cu film when the foregoing each test piece was etched using respective etching agents was investigated. A mask pattern with a given pattern (objective wiring width of 200 μm) was placed on the surface of each test piece. The results are shown in FIG. 7. In FIG. 7, the vertical axis corresponds to the position (μm) on the substrate where the line width is measured and the horizontal axis, and the horizontal axis corresponds to the depth profile (film thickness). The dot-and-broken line and the solid line in FIG. 7 denote the result of using the etching agent in the comparative example, and the result of using the etching agent in the example, respectively.

The results in FIG. 7 show that, when the etching agent in the comparative example is used, the Cu film outside of the Cu wiring area is left behind and only the periphery of the mask pattern has been etched with an abnormally rapid rate. The film is incompletely etched and the width of the Cu wiring is about 160 μm that is by about 40 μm smaller than the objective line width, indicating the presence of pattern slimming phenomenon. When the etching agent in the example is used, on the contrary, no phenomenon of abnormally rapid etching at the periphery of the mask pattern is observed besides leaving no Cu film behind except the wiring portion. In addition, the width of the Cu wiring is about 200 µm, showing that a Cu wiring with excellent dimensional accuracy has been formed.

Example 3

Figure 8:
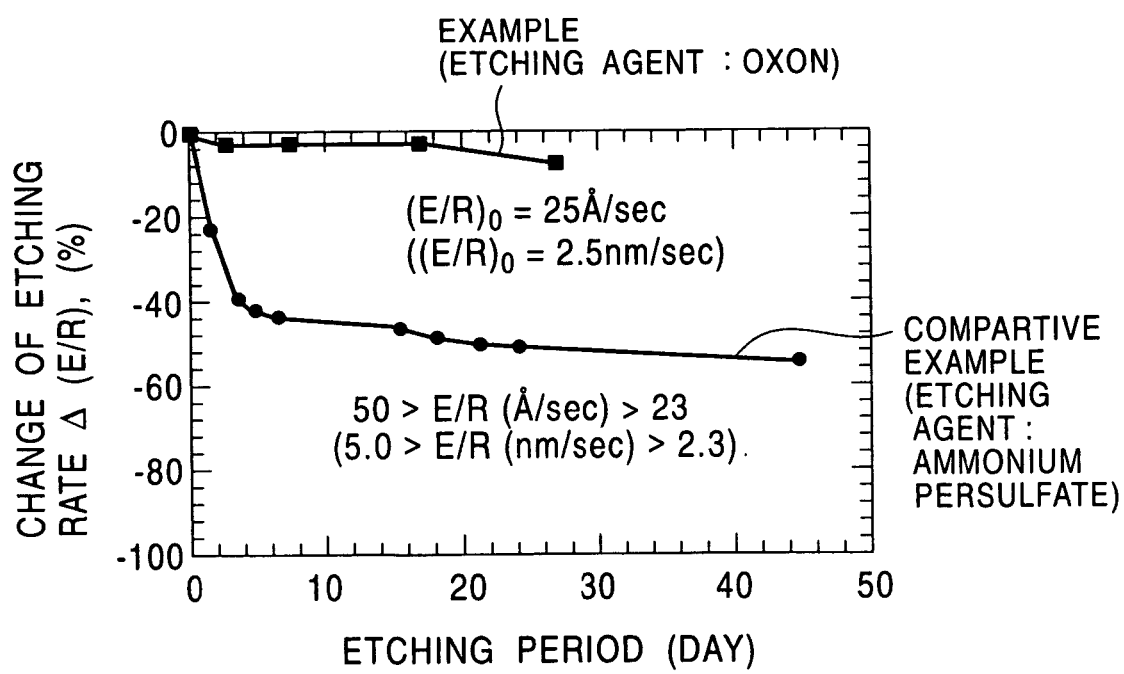
FIG. 8 shows the time-dependent change of the etching rate when the Cu film is etched using the etching agent in the example and in the comparative example.
Figure 9:
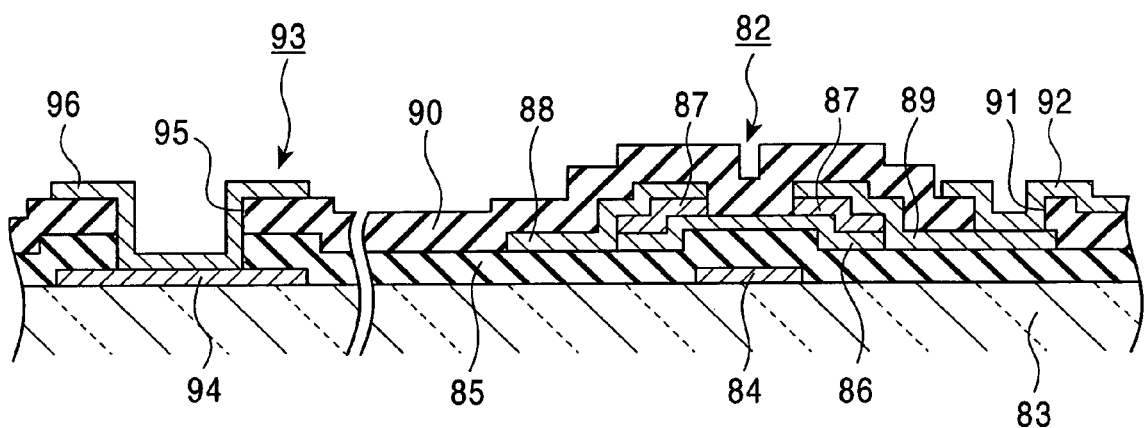
FIG. 9 is an illustrative drawing showing the thin film transistor portion of the conventional thin film transistor type liquid crystal display device.
Figure 10A:
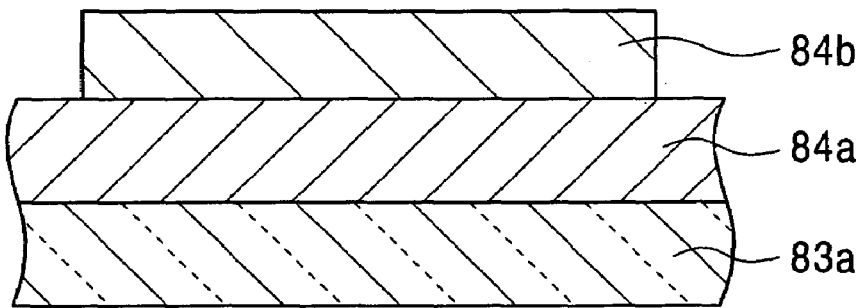
FIG. 10A shows an illustrative drawing of the first step of the method for manufacturing the conventional electronic device substrate.
Figure 10B:
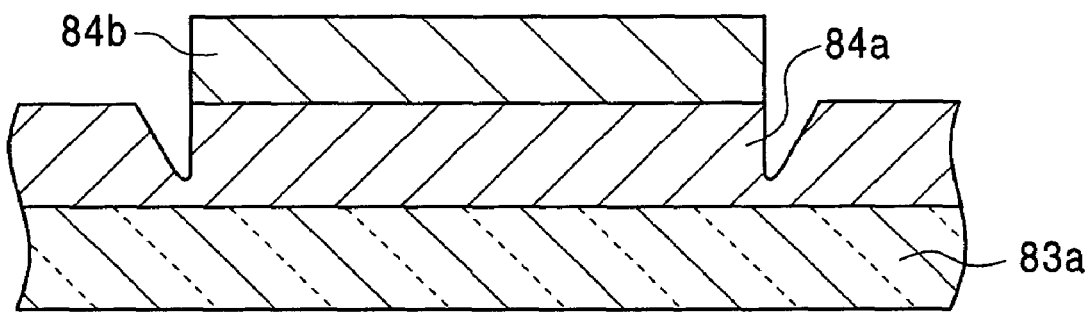
FIG. 10B shows an illustrative drawing of the second step of the method for manufacturing the conventional electronic device substrate.
Figure 10C:
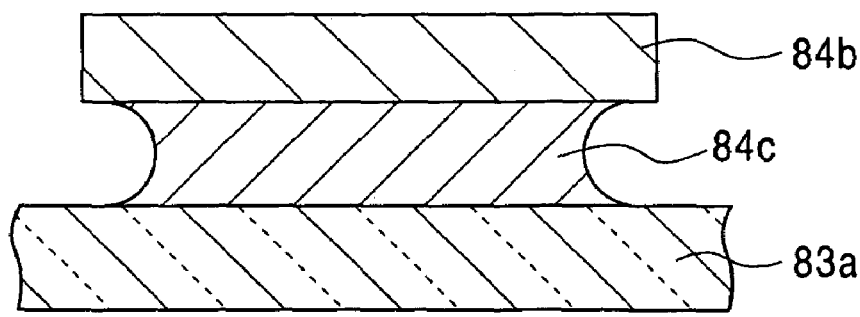
FIG. 10C shows an illustrative drawing of the third step of the method for manufacturing the conventional electronic device substrate.

An etching agent of this example comprising 0.05 mol/l of an aqueous Oxon solution (the concentration of $KHSO_5$ is 0.1 mol/l), and an etching agent of the comparative example comprising 0.05 mol/l of an aqueous solution of ammonium peroxosulfate were prepared, and the time-dependent changes of the etching rate when each test piece was etched using each etching agent were examined. The results are shown in FIG. 8. The results in FIG. 8 show that, when the etching agent of the comparative example is used, the etching rate severely changed with time from the day 1 to the day 4, and the time-dependent change decreases at day 4 and thereafter. When the etching agent in the example is used, on the contrary, the etching rate showed no change from the day 1 to the day 17, and the time-dependent change is small at day 17 and thereafter.

The results in the examples 1 to 3 suggest that the etching rate does not show any time-dependent changes to allow the amount of side-etching of the Cu film to be uniform, enabling a copper wiring with a desired line width to be readily obtained.

Example 4

Glass substrates, on which a laminated film prepared by depositing a Cu film with a thickness of 100 nm is formed on various substrate films (a Cr film, Ti film, Mo film, W film and TiN film) with a thickness of 50 nm, were immersed in an etching agent comprising 0.05M of an aqueous Oxon solution (containing 0.1 mol/l of $KHSO_4$) for 0.5 hour, and etching selectivity of the substrate metal film was investigated. The results are listed in TABLE 1.

TABLE 1

| EVALUATION ITEM | SELECTIVITY OF ETCHING | | | | |
|---|---|---|---|---|---|
| SUBSTRATE LAYER OF Cu | Cr | Ti | Mo | W | TiN |
| (ETHCING AGENT) AQUEOUS OXON SOLUTION ($KHSO_5$ 0.1M) | x | x | Δ | x | x | x . . . not etched
Δ . . . 8 nm/mm (80 Å/mm)

The results in TABLE 1 show that the Cr film of the laminated film comprising the Cr film and the Cu film, the Ti film of the laminated film comprising the Ti film and the Cu film, the W film of the laminated film comprising the W film and Cu film, and the TiN film of the laminated film comprising the TiN film and the Cu film were all not etched when the 0.05M aqueous Oxon solution was used as the etching agent. It was also revealed that the Mo film in the laminated film of the Mo film and the Cu film was etched in a rate of 8 nm/min. The Cu film in all the laminated films was etched at a rate of 160 nm/min when the Cu film with a thickness of 300 nm was used in the laminated film.

Example 5

A test piece was prepared by depositing a Cu monolayer film with a thickness of 300 nm on a glass substrate by a sputtering method or a photolithographic method, and the test piece was etched using an etching agent comprising an aqueous solution containing HF, ammonium peroxosulfate [$(NH_4)_2S_2O_8$] and HCl (the concentration of HF was 0.2% and the concentration of $(NH_4)_2S_2O_8$ was 2%). The HCl concentration dependency of the etching depth of the Cu film was investigated by changing the HCl concentration in the etching agent in a range of 0% to 0.5%. The results are shown in FIG. 12.

Figure 12:
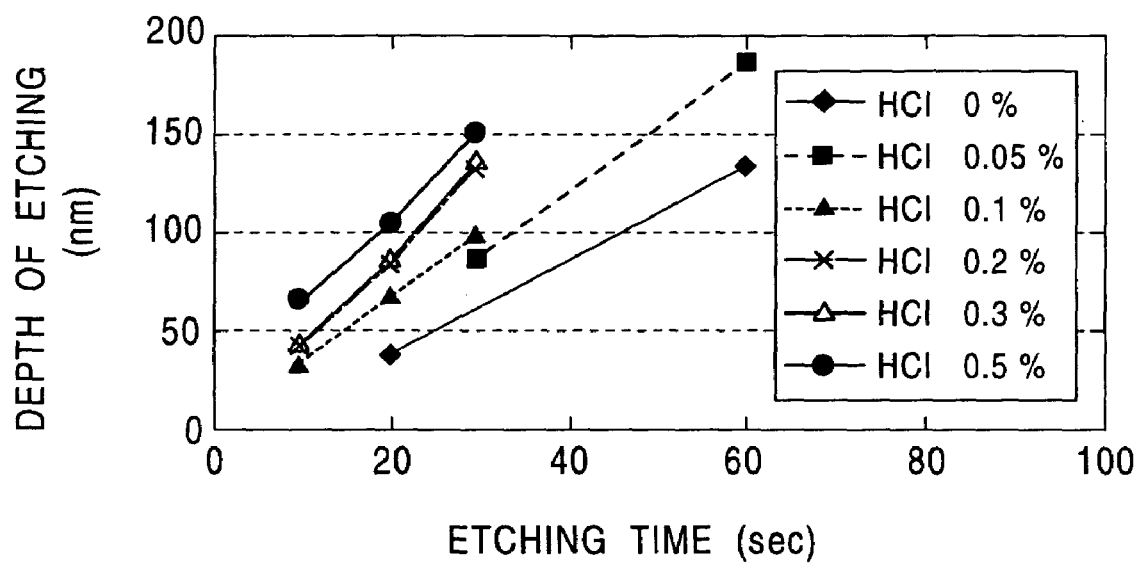
FIG. 12 is a graph showing the HCl concentration dependency of the etching depth of the Cu monolayer film when the HCl concentration in the etching agent is changed within a range of 0% to 0.5%.

The results in FIG. 12 show that, when the test piece on which the Cu monolayer film was formed was etched using an etching agent comprising an aqueous solution containing HF, ammonium peroxosulfate [$(NH_4)_2S_2O_8$] and HCl, the etching rates were about 300 nm/min at a HCl concentration of 0.5% and about 130 nm/min at a HCl concentration of 0%, indicating that the etching depth increases as the HCl concentration (the Cl$^-$ ion concentration) increases.

It was also shown that the etching depth increases as the HCl concentration (the Cl$^-$ ion concentration) increases, even when an etching agent containing KCl or $NH_4Cl$ instead of HCl is used.

The results above show that the etching rate of the Cu monolayer film can be increased when the Cl concentration in the etching agent comprising an aqueous solution containing a peroxosulfate salt, hydrofluoric acid and hydrochloric acid is increased.

Example 6

A test piece on which a Ti monolayer film with a film thickness of 50 nm was deposited on the surface of a glass substrate by a sputtering method or a photolithographic method was prepared, and the test piece was etched using an etching agent comprising an aqueous solution containing HF, ammonium peroxosulfate [$(NH_4)_2S_2O_8$] and HCl (the concentration of HF is 0.2% and the concentration of $(NH_4)_2S_2O_8$ is 2%). The HCl concentration dependency of the etching-off time (the time interval before etching is completed) was investigated by changing the HCl concentration in the etching agent within a range of 0% to 0.5%. The results are shown in FIG. 13.

Figure 13:
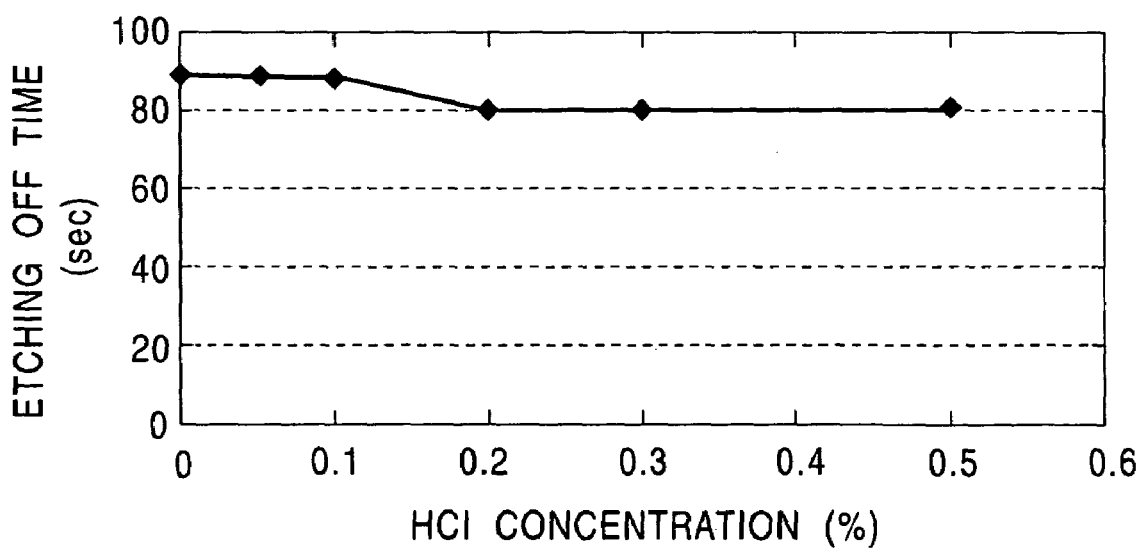
FIG. 13 is a graph showing the HCl concentration dependency of the etching-off time of the Ti monolayer film when the HCl concentration in the etching agent is changed within a range of 0% to 0.5%.

The results in FIG. 13 show that the etching rate remains approximately constant since the etching-off time did not shown any change by the change of the HCl concentration, when the test piece on which the Ti monolayer film had been formed was etched using the etching agent comprising the aqueous solution containing HF, ammonium peroxosulfate [$(NH_4)_2S_2O_8$] and HCl. This is because, when a wiring comprising the Ti monolayer film is deposited by a sputtering method and photolithographic method, a $TiO_x$ film with a thickness of about 2 to 5 nm, which can be hardly etched, has been formed on the surface of the wiring to diminish the etching rate.

Example 7

Figure 14:
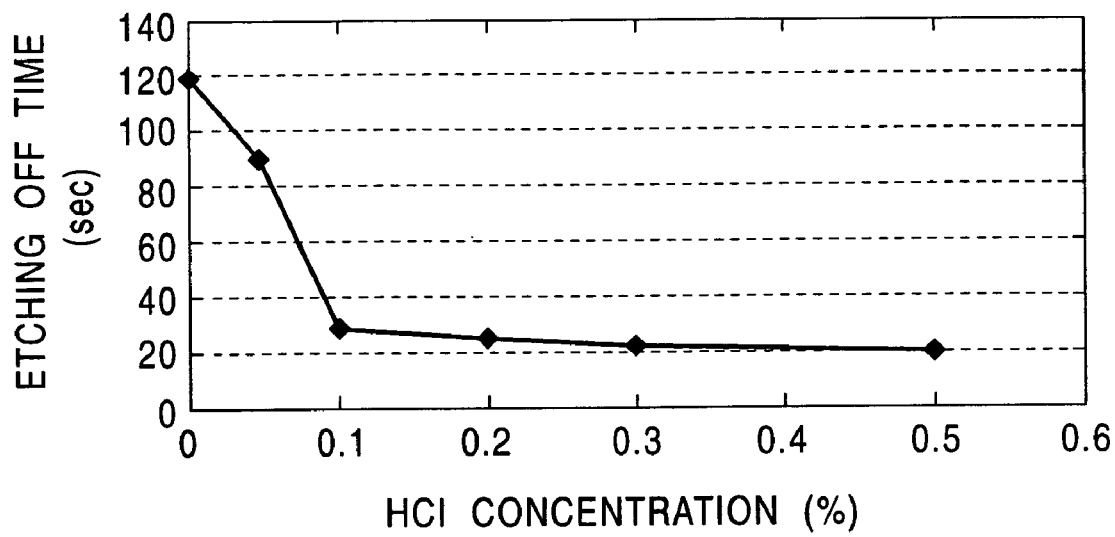
FIG. 14 is a graph showing the HCl concentration dependency of the etching-off time of the laminated film comprising the Ti film and the Cu film when the HCl concentration in the etching agent is changed within a range of 0% to 0.5%.

A test piece was prepared by depositing a laminated film comprising a Ti film with a thickness of 50 nm and a Cu film with a thickness of 100 nm on a glass substrate by a sputtering method or a photolithographic method. This test piece was etched using an etching agent comprising an aqueous solution containing HF, ammonium peroxosulfate [$(NH_4)_2S_2O_8$] and HCl (the concentration of HF is 0.2% and the concentration of $(NH_4)_2S_2O_8$ is 2%), and the HCl concentration dependency of the etching-off time (the time interval before completing etching) of the laminated film comprising the Ti film and the Cu film was investigated by changing the concentration of HCl within a range of 0% to 0.5%. The results are shown in FIG. 14. The Ti film on the laminated film and the Cu film thereon was continuously deposited by the sputtering method without exposing to the air.

The results in FIG. 14 show that, when the test piece on which the laminated film comprising the Ti film and the Cu film had been formed was etched using the etching agent comprising the aqueous solution containing HF, ammonium peroxosulfate [$(NH_4)_2S_2O_8$] and HCl, the etching-off time is reduced as the concentration of HCl (the concentration of $Cl^-$ ion) is increased, or the etching rate is increased.

The results in FIGS. 12 to 14 show that, while the time required for etching a Cu monolayer film to a depth of 100 nm is about 24 seconds, and the etching-off time of the test piece on which a Ti monolayer film with a thickness of 50 nm is formed is about 90 seconds, the etching-off time of the test piece on which the laminated film was formed by continuously depositing the Ti film with a thickness of 50 nm and the Cu film with a thickness of 100 nm is about 30 seconds. Accordingly, the aqueous solution containing HF and ammonium peroxosulfate [$(NH_4)_2S_2O_8$] allows the etching-off time required for etching the Ti monolayer film to be largely shorter than the etching-off time required for etching the laminated film comprising the Ti film and the Cu film, and the test piece is etched with an etching rate close to the etching rate for etching the Cu monolayer film. Etching in a short period of time is possible in this case because the laminated film is not exposed to the air before depositing the Cu film in the continuous deposition of the Ti film and the Cu film, forming no $TiO_x$ film on the surface of the Ti film.

Accordingly, when the aqueous solution of HF, ammonium peroxosulfate and HCl is used for the etching agent of the laminated film comprising the Ti film and the Cu film, the laminated film is collectively etched without leaving any etching residues to make it possible to form a laminated wiring having a desired line width with high precision, thereby enabling the manufacturing process to be simplified and the manufacturing yield to be improved.

Example 8

Figure 15:
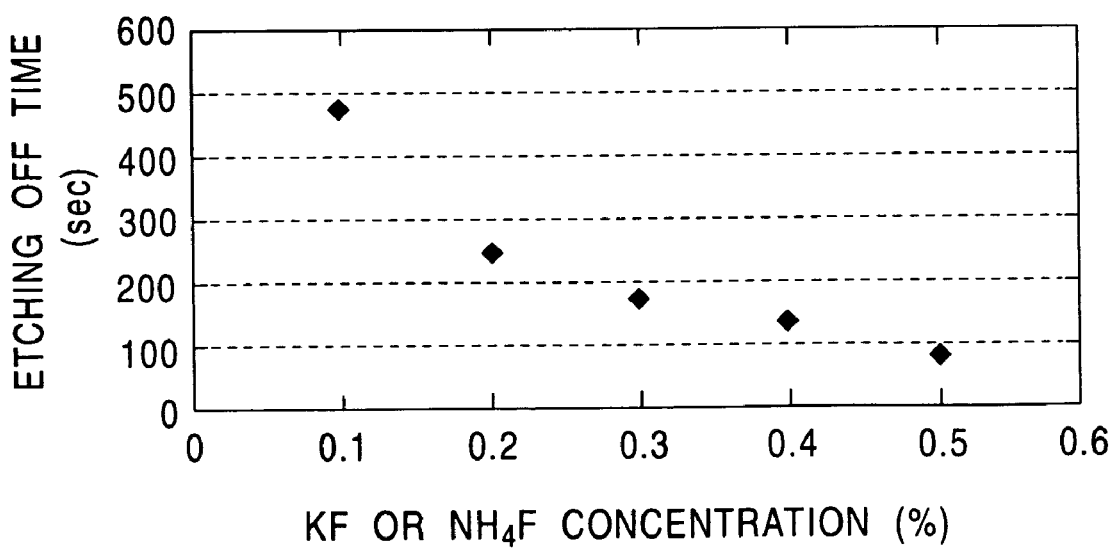
FIG. 15 is a graph showing the KF or $NH_4F$ concentration dependency of the etching-off time of the laminated film comprising the Ti film and the Cu film when the KF or $NH_4F$ concentration in the etching agent is changed within a range of 0% to 0.5%.

A test piece was prepared by depositing a laminated film comprising a Ti film (a substrate layer) with a thickness of 50 nm and a Cu film with a thickness of 100 nm on a glass substrate by a sputtering method or a photolithographic method. This test piece was etched using an etching agent comprising an aqueous solution containing KF or $MH_4F$, 3% of Oxon (made by Aldrich Co., an aqueous solution containing 2 $KHSO_5.KHSO_4.K_2SO_4$), and the KF or $NH_4F$, and concentration dependency of the etching-off time (the time interval before completing etching) of the laminated film comprising the Ti film and the Cu film was investigated by changing the concentration of KF or $NH_4F$ within a range of 0% to 0.5%. The results are shown in FIG. 15. The Ti film on the laminated film and the Cu film thereon was continuously deposited by the sputtering method without exposing to the air.

The results in FIG. 15 show that the test piece on which the laminated film comprising the Ti film and the Cu film has been formed can be etched using the etching agent comprising the aqueous solution containing KF or $NH_4F$, and 3% of Oxon. The etching-off time is reduced as the KF or $NH_4F$ concentration (the $F^-$ ion concentration) increases, showing no etching residues as well as high etching rate. Collective etching of the laminated film comprising the Ti film and the Cu film is possible when the etching agent contains $F^-$ ion other than a peroxosulfate salt, even when the etching agent does not contain HF.

Example 9

A test piece was prepared by depositing a Cu monolayer film with a thickness of 300 nm on a glass substrate by a sputtering method or a photolithographic method. This test piece was etched using an etching agent comprising an aqueous solution containing KF or HF, and 3% of Oxon (trade name, made by Aldrich Co., and aqueous solution containing 2 $KHSO_5.KHSO_4.K_2SO_4$) (the concentration of HF is 0.2% and the concentration of $(NH_4)_2S_2O_8$ is 2%), and the relations between the etching time and the etching depth of the Cu monolayer film were investigated when the concentration of KF in the etching agent was changed within a range of 0.1% to 0.5%, and when HF was used instead of KF. The results are shown in FIG. 16.

Figure 16:
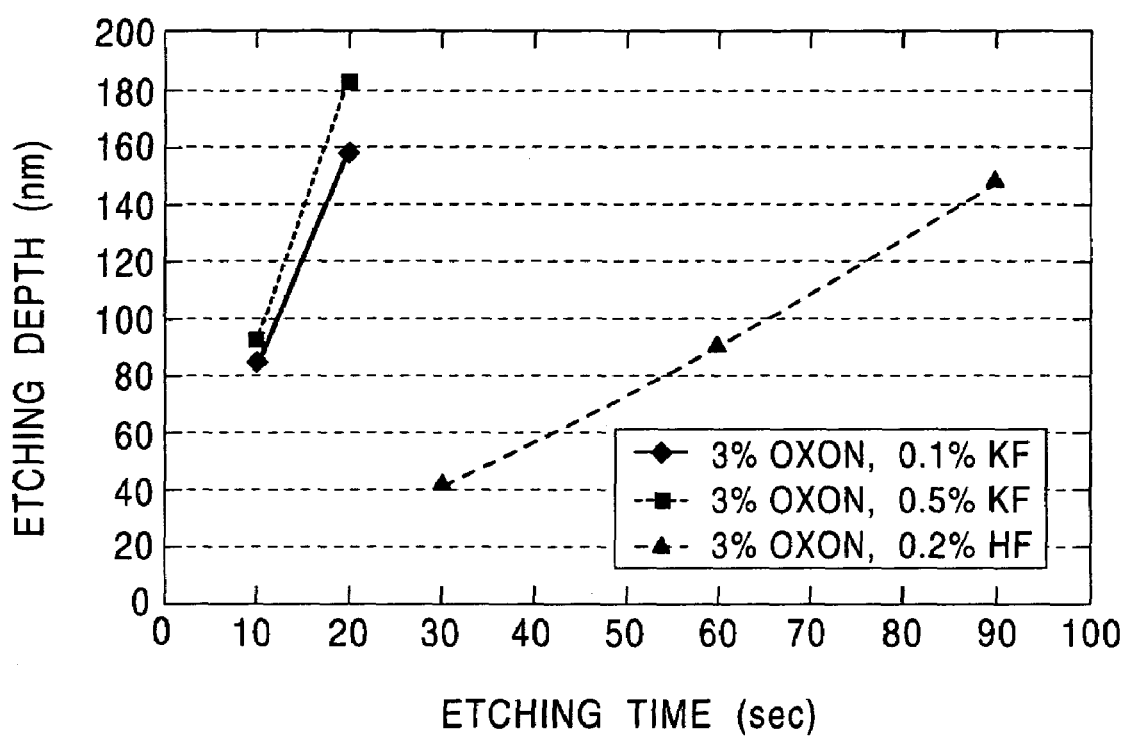
FIG. 16 is a graph showing the relations between the etching time and the etching depth of the Cu monolayer film when the KF concentration in the etching agent is changed within a range of 0.1% to 0.5%, and when 0.2% HF is used instead of KF.

The results in FIG. 16 show that the etching rate for etching the test piece on which the Cu monolayer film is formed is higher when the etching agent contains KF than when the etching agent contains HF. Together with the fact that the etching rate turns out to be higher when the KF concentration in the etching agent is 0.5% than when the KF concentration in the etching agent is 0.1%, it is evident that the larger KF concentration ($F^-$ ion concentration) results in better etching efficiency.

It is also evident that the etching rate may be more readily controlled when the etching agent contains HF, although the etching rate is lower, than when the etching agent contains KF.

As hitherto described in detail, the etching agent for copper comprising an aqueous solution of potassium hydrogen peroxomonosulfate according to the present invention allows the Cu film to be etched by a simple chemical etching method such as a stationary immersion method with no time-dependent change of the etching rate as well as with a uniform amount of side-etching of the Cu film, thereby making it possible to obtain a copper wiring with a desired line width.

What is claimed is:

1. An aqueous anisotropic copper etching agent consisting of potassium hydrogen peroxomonosulfate having a concentration within a range of about 0.08 to about 2.0 mol/l, and acetic acid, said etching agent etching the copper at an approximately uniform rate throughout the etching process, wherein the acetic acid functions as a wetting agent, and wherein the acetic acid is within a range of about 10 wt. % to about 75 wt. % relative to the potassium hydrogen peroxomonosulfate.

2. An etching agent according to claim 1, wherein said etching agent selectively etches copper.

3. An anisotropic copper etching agent for anisotropically etching a copper layer having an overlying mask pattern in an etching process, the etching agent consisting of an aqueous solution including potassium hydrogen peroxomonosulfate having a concentration within a range of about 0.08 to about 2.0 mol/l and acetic acid within a range of about 10 wt. % to about 75 wt. % relative to the potassium hydrogen peroxomonosulfate, said etching agent etching the copper layer at an approximately uniform rate throughout the etching process, such that edges of the copper layer are substantially continuous with corresponding edges of the mask pattern.

4. An etching agent according to claim 3, wherein said etching agent selectively etches the copper layer.

5. An aqueous anisotropic copper etching solution, wherein the etching solution is formulated to anisotropically etch a copper layer having a mask pattern thereon, the solution consisting of potassium hydrogen peroxomonosulfate and acetic acid, wherein the acetic acid continuously wets exposed surfaces of the copper layer and the potassium hydrogen peroxomonosulfate uniformly etches the copper layer, such that the copper layer is etched to substantially the same dimensions as the mask pattern, and wherein the acetic acid is within a range of about 10 wt. % to about 75 wt. % relative to the potassium hydrogen peroxomonosulfate.

6. The aqueous anisotropic copper etching solution of claim 5, wherein the solution comprises a potassium hydrogen peroxomonosulfate concentration of about 0.08 to about 2.0 mol/l.

7. The aqueous anisotropic copper etching solution of claim 6, wherein the solution comprises a weight ratio of acetic acid to potassium hydrogen peroxomonosulfate of about 10% to about 75%.

8. The aqueous anisotropic copper etching solution of claim 5, wherein the copper layer has a thickness of about 100 nm to about 200 nm.

9. The aqueous anisotropic copper etching solution of claim 5, wherein the solution etches the copper layer such that edges of the copper layer are substantially continuous with corresponding edges of the mask pattern.

10. The aqueous anisotropic copper etching solution of claim 5, wherein the copper layer is layer comprises a gate electrode.

11. The aqueous anisotropic copper etching solution of claim 5, wherein the copper layer comprises a wiring layer.

12. An aqueous etching agent consisting of potassium hydrogen peroxomonosulfate having a concentration within a range of about 0.08 to about 2.0 mol/l, and acetic acid, wherein the acetic acid is within a range of about 10 wt. % to about 75 wt. % relative to the potassium hydrogen peroxomonosulfate.

* * * * *